(12) United States Patent
Kehoe

(10) Patent No.: US 7,898,818 B2
(45) Date of Patent: Mar. 1, 2011

(54) VARIABLY ORIENTATED CAPACITIVE ELEMENTS FOR PRINTED CIRCUIT BOARDS AND METHOD OF MANUFACTURING SAME

(75) Inventor: Daniel W. Kehoe, Cedar Park, TX (US)

(73) Assignee: Dell Products, LP, Round Rock, TX (US)

( * ) Notice: Subject to any disclaimer, the term of this patent is extended or adjusted under 35 U.S.C. 154(b) by 961 days.

(21) Appl. No.: 11/683,144

(22) Filed: Mar. 7, 2007

(65) Prior Publication Data

US 2008/0218937 A1    Sep. 11, 2008

(51) Int. Cl.
*H05K 1/18*    (2006.01)
(52) U.S. Cl. .................. 361/763; 361/761; 361/766; 361/782
(58) Field of Classification Search ......... 361/300–308, 361/318, 760–766
See application file for complete search history.

(56) References Cited

U.S. PATENT DOCUMENTS

| | | | | |
|---|---|---|---|---|
| 4,328,530 A | * | 5/1982 | Bajorek et al. ............. | 361/762 |
| 4,715,118 A | * | 12/1987 | Bernard et al. ............. | 29/856 |
| 6,165,866 A | * | 12/2000 | Kobayashi ................. | 438/396 |
| 6,473,291 B1 | * | 10/2002 | Stevenson ................. | 361/306.3 |
| 6,822,847 B2 | * | 11/2004 | Devoe et al. ............... | 361/303 |
| 6,831,824 B1 | * | 12/2004 | Devoe et al. ............... | 361/306.1 |
| 6,860,954 B2 | | 3/2005 | Mamada | |
| 6,924,967 B1 | * | 8/2005 | Devoe ...................... | 361/301.4 |
| 7,633,739 B2 | * | 12/2009 | Devoe ...................... | 361/306.3 |

* cited by examiner

*Primary Examiner*—Tuan T Dinh
(74) *Attorney, Agent, or Firm*—Larson Newman & Abel, LLP

(57) ABSTRACT

Variably oriented capacitive elements for printed circuit boards (PCBs) and method of manufacturing the same. In one form the disclosure, a PCB can include a first multiple-layered capacitor including a first orientation and placed along a surface operable to mount electronic components. The PCB can also include a second multiple-layered capacitor including a second orientation different from the first. The second multiple-layered capacitor can be placed along the surface near the first multiple-layered capacitor.

11 Claims, 5 Drawing Sheets

VARIABLY ORIENTATED CAPACITIVE ELEMENTS FOR PRINTED CIRCUIT BOARDS AND METHOD OF MANUFACTURING SAME

FIELD OF THE DISCLOSURE

This disclosure relates generally to information handling systems, and more particularly to variably oriented capacitive elements for printed circuit boards (PCBs) and method of manufacturing same.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements can vary between different applications, information handling systems can also vary regarding what information is handled, how the information is handled, how much information is processed, stored, or communicated, and how quickly and efficiently the information can be processed, stored, or communicated. The variations in information handling systems allow for information handling systems to be general or configured for a specific user or specific use such as financial transaction processing, airline reservations, enterprise data storage, or global communications. In addition, information handling systems can include a variety of hardware and software components that can be configured to process, store, and communicate information and can include one or more computer systems, data storage systems, and networking systems.

Various information handling systems can be realized as portable systems having densely populated components and devices. For example, some portable systems include printed circuit board PCBs having capacitors that are periodically charged and discharged based on operating conditions. In some instances, ceramic capacitors are used with PCBs. However, ceramic capacitors can experience deformation that can lead to undesirable audible tones or noise called "cap singing." For example, ceramic capacitors vibrating from the converse-piezoelectric effect can cause the board to vibrate and produce an audible noise. In one instance, a switching regulator's output voltage changes levels in a regular rhythm and the input capacitors are subject to current surges and corresponding voltage decreases causing the ceramic capacitors to react by changing shape and causing the PCB to vibrate.

Various efforts to reduce such operating conditions have been only moderately successful. For example, some solutions have included mounting capacitive elements on opposing sides of PCBs to reduce the effects of cap singing. However, capacitive elements mounted on opposing sides may not be possible due to layout restrictions. Other solutions have included adding noise absorbing materials to absorb audible tones or noise caused from cap singing. Another solution can include using aluminum electrolytic capacitors. However, these capacitors are typically geometrically too large and possess temperature and cost imitations. Such solutions are not standard and have increased the overall production cost of PCBs.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

Figure 1:
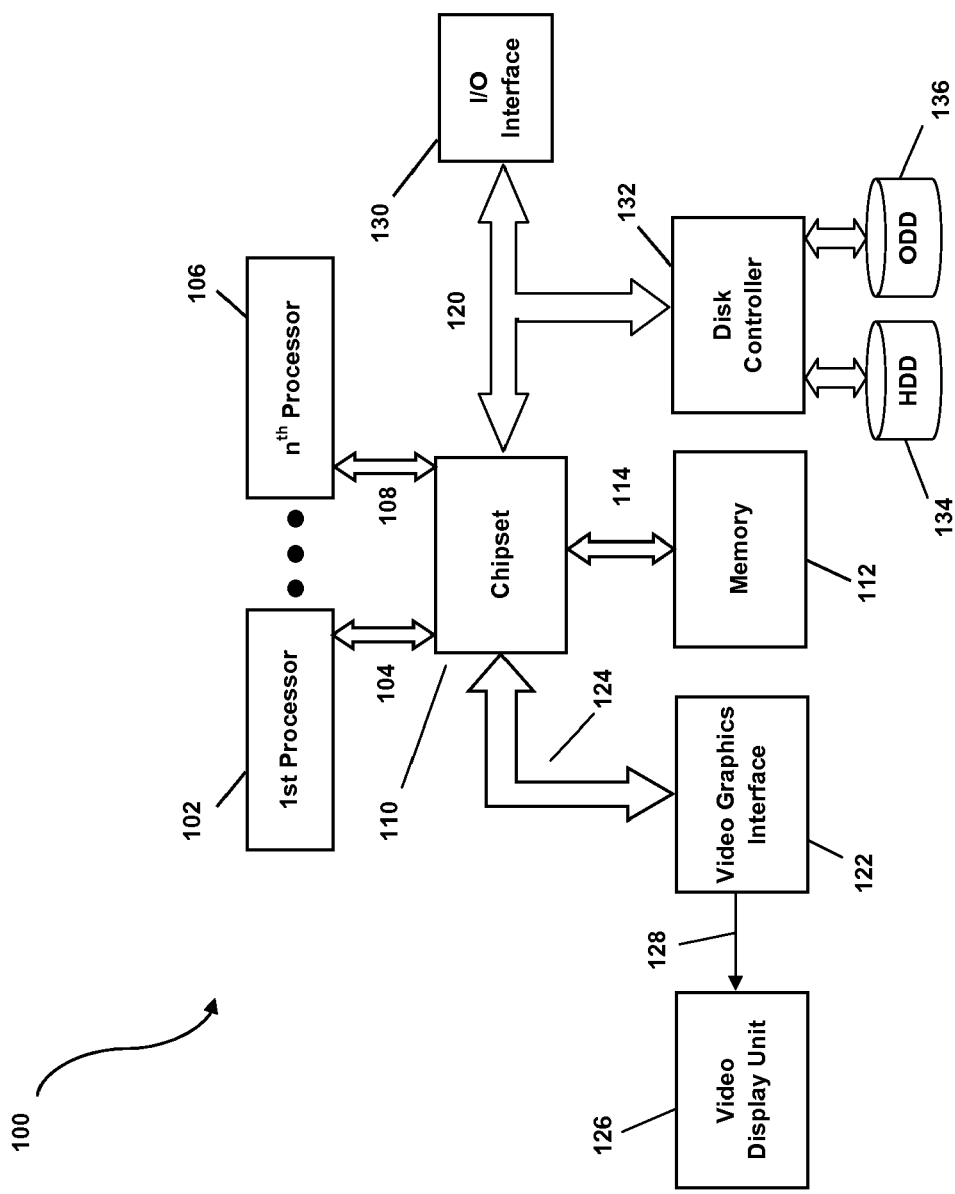
FIG. 1 illustrates a block diagram of an information handling system according to one aspect of the disclosure.

The following description in combination with the Figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application. The teachings can also be utilized in other applications and with several different types of architectures such as distributed computing architectures, client/server architectures, laptop computing architectures, desktop computing architectures, or middleware server architectures and associated components.

For purposes of this disclosure, an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system can be a personal computer, a PDA, a consumer electronic device, a network server or storage device, a switch router, wireless router, or other network communication device, or any other suitable device and can vary in size, shape, performance, functionality, and price. The information handling system can include memory, one or more processing resources such as a central processing unit (CPU) or hardware or software control logic. Additional components of the information handling system can include one or more storage devices, one or more communications ports for communicating with external devices as well as various input and output (I/O) devices, such as a keyboard, a mouse, and a video display. The information handling system can also include one or more buses operable to transmit communications between the various hardware components.

According to one aspect of the disclosure, a PCB can include a first multiple-layered capacitor including a first orientation and placed along a surface operable to mount electronic components. The PCB can also include a second multiple-layered capacitor including a second orientation different from the first multiple-layered capacitor. The second multiple-layered capacitor can be placed along the surface near the first multiple-layered capacitor.

According to another aspect of the disclosure, a method of using capacitors with PCBs can include determining an orientation of a multiple-layered element housed within a first multiple-layered capacitor. The method can also include providing a reference to the orientation in connection with mounting the first multiple-layered capacitor to a PCB. The method can also include loading the first multiple-layered capacitor using the reference.

According to a further aspect of the disclosure, an information handling system can include a PCB having a first horizontal orientated multiple-layered capacitor placed along a surface of the PCB. The PCB can also include a second vertical orientated multiple-layered capacitor placed along the surface of the PCB near the first multiple-layered capacitor. The information handling system can also include an input power source operably associated with the capacitors. The input power source can be used to charge the first multiple-layered capacitor and the second multiple-layered capacitor at approximately the same time.

FIG. 1 illustrates a block diagram of an exemplary embodiment of an information handling system, generally designated at 100. In one form, the information handling system 100 can be a computer system such as a laptop or portable computer, desktop computer, or other computing device. As shown in FIG. 1, the information handling system 100 can include a first physical processor 102 coupled to a first host bus 104 and can further include additional processors generally designated as $n^{th}$ physical processor 106 coupled to a second host bus 108. The first physical processor 102 can be coupled to a chipset 110 via the first host bus 104. Further, the $n^{th}$ physical processor 106 can be coupled to the chipset 110 via the second host bus 108. The chipset 110 can support multiple processors and can allow for simultaneous processing of multiple processors and support the exchange of information within information handling system 100 during multiple processing operations.

According to one aspect, the chipset 110 can be referred to as a memory hub or a memory controller. For example, the chipset 110 can include an Accelerated Hub Architecture (AHA) that uses a dedicated bus to transfer data between the first physical processor 102 and the $n^{th}$ physical processor 106. For example, the chipset 110, including an AHA enabled-chipset, can include a memory controller hub and an I/O controller hub. As a memory controller hub, the chipset 110 can function to provide access to first physical processor 102 using first bus 104 and $n^{th}$ physical processor 106 using the second host bus 108. The chipset 110 can also provide a memory interface for accessing memory 112 using a memory bus 114. In a particular embodiment, the buses 104, 108, and 114 can be individual buses or part of the same bus. The chipset 110 can also provide bus control and can handle transfers between the buses 104, 108, and 114.

According to another aspect, the chipset 110 can include an application specific chipset that provides connectivity to various buses, and integrates other system functions. For example, the chipset 110 can be provided using an Intel® Hub Architecture (IHA) chipset that can also include two parts, a Graphics and AGP Memory Controller Hub (GMCH) and an I/O Controller Hub (ICH). For example, an Intel 820E, an 815E chipset, 975X chipset, G965 chipset, or any combination thereof, available from the Intel Corporation of Santa Clara, Calif., can provide at least a portion of the chipset 110. The chipset 110 can also be packaged as an application specific integrated circuit (ASIC).

The information handling system 100 can also include a video graphics interface 122 that can be coupled to the chipset 110 using a third host bus 124. In one form, the video graphics interface 122 can be an Accelerated Graphics Port (AGP) interface or a Peripheral Component Interconnect (PCI) Express interface to display content within a video display unit 126. Other graphics interfaces may also be used. The video graphics interface 122 can provide a video display output 128 to the video display unit 126. The video display unit 126 can include one or more types of video displays such as a flat panel display (FPD) or other type of display device.

The information handling system 100 can also include an I/O interface 130 that can be connected via an I/O bus 120 to the chipset 110. The I/O interface 130 and I/O bus 120 can include industry standard buses or proprietary buses and respective interfaces or controllers. For example, the I/O bus 120 can also include a PCI bus or a high speed PCI-Express bus. In one embodiment, a PCI bus can be operated at approximately 66 MHz and a PCI-Express bus can be operated at more than one (1) speed (e.g., 2.5 GHz, 5.0 GHz.). PCI buses and PCI-Express buses can be provided to comply with industry standards for connecting and communicating between various PCI-enabled hardware devices. Other buses can also be provided in association with, or independent of, the I/O bus 120 including, but not limited to, industry standard buses or proprietary buses, such as Industry Standard Architecture (ISA), Small Computer Serial Interface (SCSI), Serial ATA (SATA), Inter-Integrated Circuit ($I^2C$), System Packet Interface (SPI), or Universal Serial buses (USBs).

In an alternate embodiment, the chipset 110 can be a chipset employing a Northbridge/Southbridge chipset configuration (not illustrated). For example, a Northbridge portion of the chipset 110 can communicate with the first physical processor 102 and can control interaction with the memory 112, the I/O bus 120 that can be operable as a PCI bus, and activities for the video graphics interface 122. The Northbridge portion can also communicate with the first physical processor 102 using first bus 104 and the second bus 108 coupled to the $n^{th}$ physical processor 106. The chipset 110 can also include a Southbridge portion (not illustrated) of the chipset 110 and can handle I/O functions of the chipset 110. The Southbridge portion can manage the basic forms of I/O such as USB, serial I/O, audio outputs, Integrated Drive Electronics (IDE), and ISA I/O for the information handling system 100.

The information handling system 100 can further include a disk controller 132 coupled to the I/O bus 120, and connecting one or more internal disk drives such as a hard disk drive (HDD) 134 and an optical disk drive (ODD) 136 such as a Read/Write Compact Disk (R/W CD), a Read/Write Digital Video Disk (R/W DVD), a Read/Write mini-Digital Video Disk (R/W mini-DVD), or other type of optical disk drive.

The information handling system 100 can include one or more PCBs for mounting and interconnecting various components illustrated in FIG. 1. A PCB can be used to couple various types of electronic devices, including, but not limited to, microelectronics, resistive elements, capacitive elements, inductive elements, analog devices, digital devices, or any combination thereof, arranged on a PCB to provide all, or portions of, the information handling system 100. In one form, the information handling system 100 can include multiple PCBs including various component or devices.

According to one aspect, the information handling system 100 can include a PCB having a horizontal orientated multiple-layered capacitor and a vertical orientated ceramic capacitor. In one form, a multiple-layered capacitor can include a ceramic capacitor. Other types of materials, composite materials, or any combination thereof, can be used to for a multiple-layered capacitor. Each capacitor can be coupled to a power source, power bus, power plane, etc. operably associated with providing power to one or more components or devices coupled to the PCB. The capacitors can include various types of ceramic capacitors, and in one form, can include a multi-layered ceramic capacitor. Additionally, various capacitive values can also be employed. In one form, one or more multiple-layered capacitors can include a value including a value of approximately ten (10) microfarads operating at twenty-five (25) volts. Various other capacitive values can also be used such as twenty-two (22) microfarads, 5.6 microfarads, 4.7 microfarads, or various other values. Voltage ratings can also vary depending on the application and in some forms can include values of 16-25 Volts, or a value or rating that is higher than the applied voltage. In one form, a ceramic capacitor manufactured by Taiyo Yuden, Part # TMK316BJ106ML-T, TDK Part # C3216X5R1E106MT, or others can be used. Additionally, various dielectrics can be used include X7R, X5R, Y5U, Y5V, X6S, or any combination thereof.

Figure 2:
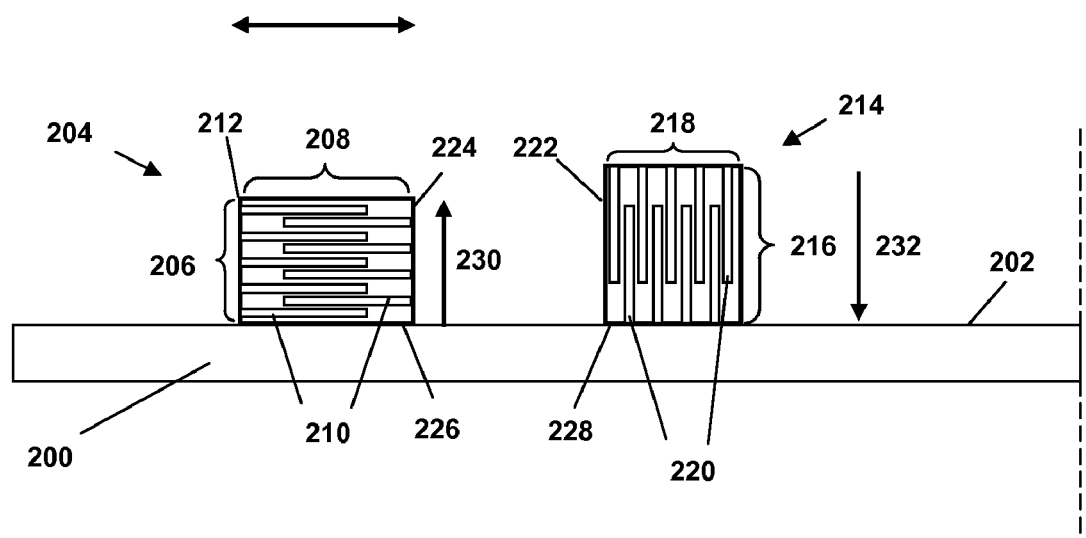
FIG. 2 illustrates a side perspective view of a PCB including horizontal and vertical oriented capacitive elements mounted to the PCB according to one aspect of the disclosure.

FIG. 2 illustrates a side perspective view of a printed circuit board including horizontal and vertical oriented capacitive elements mounted to a PCB according to one aspect of the disclosure. The PCB, generally depicted at 200, can be used by the information handling system 100 illustrated in FIG. 1, or any other information handling system operable to employ the PCB 200. Additionally, a side perspective view of the PCB 200 is illustrated to illustrate capacitors coupled along a portion of the PCB 200 not in a limiting sense, but to illustrate the capacitive elements. Other components can also be provided in addition to the capacitive elements of FIG. 2 to provide a PCB operable to be used by an information handling system.

The PCB 200 includes a top portion 202 that can be used to mount various electronic devices at specific locations using a PCB layout or design. The PCB 200 can include a horizontal orientated multiple-layered capacitor 204 including a first height 206 and a first width 208. The horizontal orientated multiple-layered capacitor 204 can include plural elements 210 placed within a housing 212, and the plural elements 210 can be arranged horizontally relative to the top portion 202 of PCB 200. In one form, the horizontal orientated multiple-layered capacitor 204 can include a multiple-layered ceramic capacitor that includes plural ceramic elements stacked on top of each other, and including a dimension to produce a specific capacitive value. The housing 212 can also include a side portion 224 and a bottom portion 226 coupled to the top portion 202 of the PCB 200.

The PCB 200 can also include a vertical orientated multiple-layered capacitor 214 including a second height 216 and a second width 218. The vertical orientated multiple-layered capacitor 214 also includes plural elements 220 vertical orientated relative to the top surface 202 of the PCB 200, and placed within a second housing 222. The second housing 222 can include a second bottom portion 226 coupled to the top portion 202 of the PCB 200. In one form, the horizontal orientated multiple-layered capacitor 204 and the vertical orientated multiple-layered capacitor 214 can be approximately the same capacitors having approximately the same capacitive values and dimensions. As such, the vertical orientated multiple-layered capacitor 214 can be provided as a horizontal orientated multiple-layered capacitor 204, and the horizontal orientated multiple-layered capacitor 204 can be provided as the vertical orientated capacitor 214. According to one aspect, the PCB 200 can include a vertical orientated multiple-layered capacitor 214 including a value that is different from the horizontal orientated multiple-layered capacitor 204. Additionally, various distances between the vertical orientated multiple-layered capacitor 214 and the horizontal orientated multiple-layered capacitor 204 can also be used.

During operation, as the horizontal orientated capacitor 204 is charged and discharged, the overall dimensions of the horizontally oriented capacitor 204 can be altered in response to charging and discharging the horizontal orientated capacitor 204. For example, the horizontal orientated capacitor 204 can increase in the height 206 and decrease in the width 208. The overall volume of the horizontal oriented capacitor 204 can also be maintained. For example, an inertia associated with the horizontally oriented capacitor 204 will try to maintain the horizontally oriented capacitor 204 in place. As such, a downward force may be imposed upon the upper surface 202 of the PCB 200, and the PCB 200 will resist this force and impart a corresponding upward force to the capacitor 204.

Similarly, the vertical orientated capacitor 214 can also be charged and discharged at approximately the same time as the horizontal orientated capacitor 204. Additionally, the overall dimensions of the vertical orientated capacitor 214 can be altered in response to the charging and discharging. For example, the vertical orientated capacitor 214 can be coupled to the top surface 202 and react in a similar manner as the horizontal orientated capacitor 204. However, instead of an overall increase in the second height 216, a decrease in the second height 216 can be achieved. Additionally, a second force 232 can be realized as the overall shape of the vertical orientated capacitor 214 may be altered. As such, an effective difference between forces caused by the vertical orientated capacitor 214 and the horizontal orientated capacitor 204 results in a canceling or reduction of the overall impulse felt along the top surface 202 of the PCB 200. As such, multiple-layered capacitors vibrating from the converse-piezoelectric effect that can cause the PCB 200 to vibrate and produce an audible noise can be reduced. For example, acoustic noise or cap singing that can result from using one or more capacitors having the same orientation can be reduced through providing capacitive elements having different orientations and reducing deformation and vibrations of the PCB 200.

Figure 3:
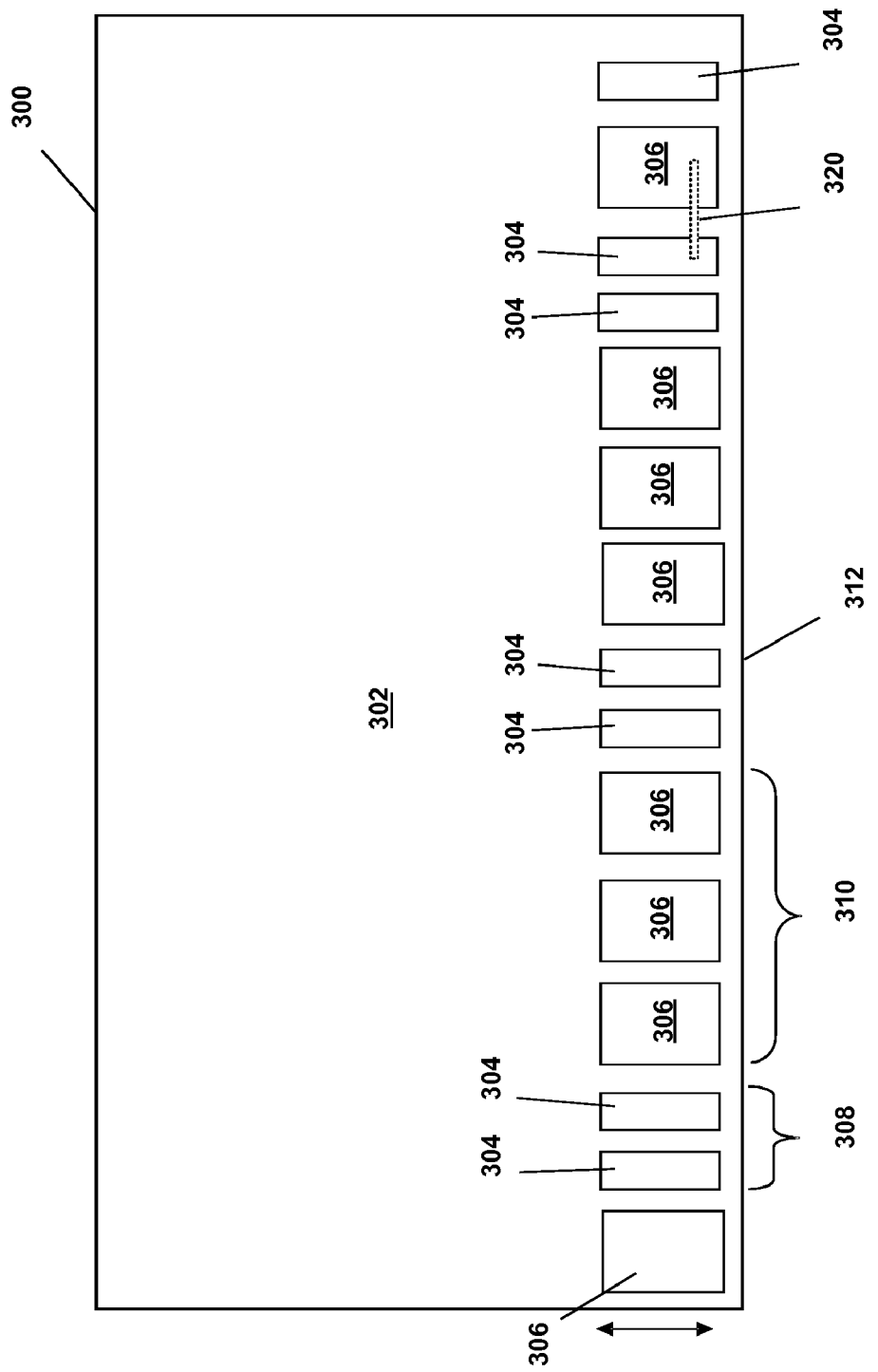
FIG. 3 illustrates a top perspective view of a PCB incorporating multiple capacitors according to another aspect of the disclosure.

FIG. 3 illustrates a top perspective view of a PCB incorporating multiple capacitors according to another aspect of the disclosure. The PCB, illustrated generally at 300, includes a top surface 302 having various capacitive elements coupled along a portion of the top surface 302. The top surface 302 can include horizontal orientated capacitive elements, illustrated at 304. In one form, the horizontal orientated capacitive elements 304 can include the horizontal orientated capacitive element 204 illustrated in FIG. 2, placed along a side portion 312 of the PCB 300. The top surface 302 can also include vertical orientated capacitive elements 306, such as the vertical orientated capacitive element 214 illustrated in FIG. 2. The vertical orientated capacitive elements can be placed along the top surface 302 of the PCB 300. The PCB 300 also includes a conductor 320 to substantially simultaneously provide input power to at least one of the horizontal oriented capacitive elements 304 and to at least one of the vertical orientated capacitive elements 306, as previously described.

The PCB 300 can include a first multiple 208 of vertical orientated capacitive elements 304 including two vertical orientated capacitive elements 304. The PCB 300 can further include a second multiple 310 of horizontal orientated capacitive elements 306 including plural horizontal orientated capacitive elements 306. Other combinations of horizontal and vertical oriented capacitive elements can also be used as desired. As such, the first multiple 308, the second multiple 310, or any combination thereof, of horizontal orientated capacitive elements 310, and vertical orientated capacitive elements 308, can be used. Additionally multiples or combinations of multiples can be used and are not limited to the number of elements or capacitive elements illustrated in FIG. 3.

According to one aspect, capacitive elements can also be arranged at various locations along the top surface 302 of the PCB 300. In one form, a single horizontal orientated capacitive element 306 can be provided with a single vertical orientated capacitive element 304. In other forms, various ratios of vertical orientated capacitive elements to horizontal orientated capacitive elements can be used. For example a 1:2 ratio, 2:3 ratio, 2:1 ratio, 4:1 ratio, or any other ratio can be used as desired. In one form, one or more capacitors can be placed along a rear portion of the PCB 200 in addition to providing vertical and horizontal oriented capacitive elements along the top surface 302. In another form, a horizontal oriented capacitive element 304 and a vertical oriented capacitive element 306 may only be placed along a rear surface of the PCB 300 as desired. In yet another form, depending on the application and a desired effect, capacitive elements can be selectively placed at various locations that may not result in the layout illustrated in FIG. 3.

During operation, as the horizontal orientated capacitive elements 306 and the vertical orientated capacitive elements 304 are used, there can be moments or forces placed on the PCB 300. For example, as different forces are caused, smaller moments or forces can be realized at different locations along the PCB 300. However, counter forces due to using multiple oriented capacitive elements can reduce an overall deformation of the capacitive elements the PCB 300 thereby reducing cap singing, deformation, or other undesirable effects that can be caused from having capacitive elements oriented in the same direction.

Figure 4:
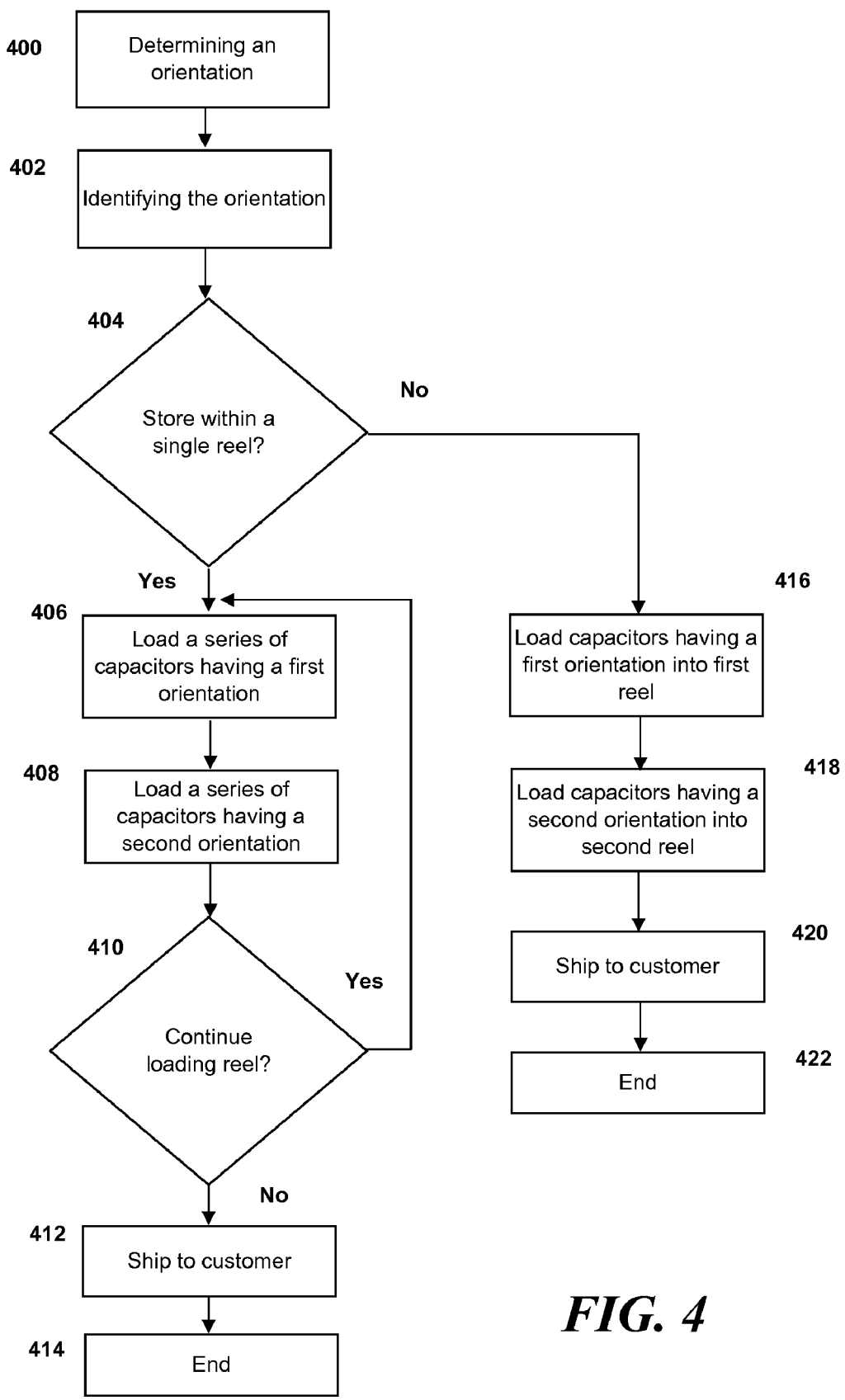
FIG. 4 illustrates a flow diagram of a method of identifying an orientation of a capacitive element to mount to a printed circuit board according to a one aspect of the disclosure.

FIG. 4 illustrates a flow diagram of a method of identifying an orientation of a capacitive element to mount to a printed circuit board according to a one aspect of the disclosure. The method of FIG. 4 can be employed in whole, or in part, an information handling system, manufacturing tool, or other automated, or semi-automated processes or any other type of system, controller, device, module, or any combination thereof, operable to employ all, or portions of, the method of FIG. 4. Additionally, the method can be embodied in various types of encoded logic including software, firmware, hardware, or other forms of digital storage mediums, computer readable mediums, or logic, or any combination thereof, operable to provide all, or portions of, the method of FIG. 4.

The method begins generally at block 400 when an orientation of a capacitor can be determined. For example, a multiple-layered ceramic capacitor can be provided having a specific shape, and in one form, can include a rectangular shape. The multiple-layered ceramic capacitor can be output by a fabrication process and having specific orientation that can be determined. In other forms, an orientation can be determined by altering a charge that may change or alter a shape of the capacitor. In other embodiments, various other techniques can be used to determine orientation including providing markings, X-Ray inspection, RFID tags, or any other determination method. In one form, plate orientation could be controlled through the manufacturing process so that the capacitive elements are output from a fabrication process having one orientation. As such, the orientation of the capacitive elements when placed within a storage reel can be controlled by either rotating or not rotation the capacitive element when placed within a storage reel. In another embodiment, a "horizontal" fabrication process and a "vertical" fabrication process within a manufacturing facility could be used to maintain orientation. A specific color for a capacitive element having horizontal or vertical orientations can also be provided.

In one embodiment, a rectangular-cross-sectioned capacitive element can be fabricated with different plate orientations. For example, a specific region of a capacitive element can be designated to mount to a PCB and, the plates within the capacitive element can be provided parallel or perpendicular to the PCB when installed.

Upon determining an orientation, the method proceeds to block 402 and identifies an orientation of the capacitor. For example, a single capacitor, or group of capacitors, can be identified as horizontal orientated capacitors or vertical orientated capacitors. As such, the method can proceed to decision block 404, and determines how a capacitor should be stored. For example, if the capacitors are to be place within a single reel, the method can proceed to block 406, and a series of capacitors having a first orientation can be loaded within a reel. For example, a series of three (3) horizontal orientated capacitors can be placed within the reel. The method can then proceed to block 408 and a second series of capacitors can be loaded within the same reel. For example, the second series of capacitors can include two (2) vertical orientated capacitors. The method can then proceed to decision block 410, and if the reel should continue to be loaded, the method can proceed to block 406 and repeat. If the loading the reel is completed (e.g. no additional capacitors are to be loaded), the method can proceed to block 412 and the reel can be shipped to the customer if desired. The method can then proceed to block 414 and end.

If at decision block 404, the capacitors are not to be loaded in the same reel, the method can proceed to block 416 and capacitors having a first orientation can be loaded into a first reel. Upon loading the capacitors having a first orientation, the method can proceed to block 418, and capacitors having a second orientation can be loaded into a different reel from the reel housing capacitors having the first orientation. Upon loading each reel, the method can proceed to block 420 and the reels can be shipped as desired, and to block 422 and the method can end. In this manner, capacitive elements including an orientation can be provided for use and installation in various systems using an orientation of a capacitive element.

Figure 5:
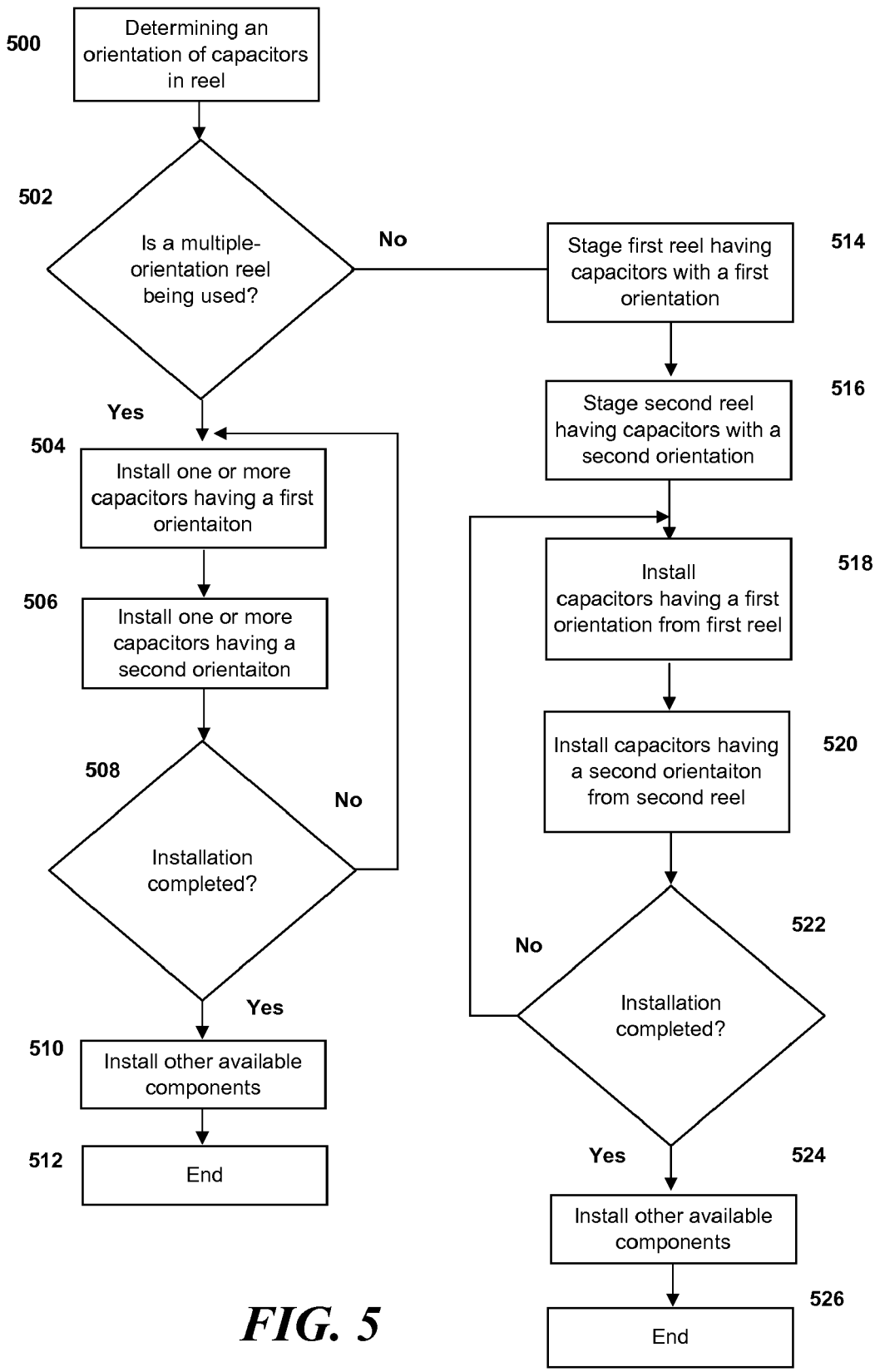
FIG. 5 illustrates a flow diagram of a method of manufacturing a printed circuit board including horizontal and vertical oriented capacitors according to a one aspect of the disclosure.

FIG. 5 illustrates a flow diagram of a method of manufacturing a printed circuit board including horizontal and vertical oriented capacitors according to one aspect of the disclosure. The method of FIG. 5 can be employed in whole, or in part, to an information handling system, manufacturing tool, or other automated, or semi-automated processes or any other type of system, controller, device, module, or any combination thereof, operable to employ all, or portions of, the method of FIG. 5.

The method begins at block 500 and an orientation of the capacitors provided within a reel can be determined. For example, a reel can include a capacitor having a horizontal orientated, a vertical orientation, other orientations, or any combination thereof. In one form, a reel can include a marking, barcode, or other type of identifier that can be used to identify an orientation of the capacitors within a reel. In one form, the reel can be identified using an automated identification process, and can be used within an automated, or semi-automated, or manual PCB manufacturing facility.

At decision block 502, the method determines if a multiple-oriented reel is being used. For example, if a reel includes capacitive elements having multiple orientations placed within a reel in predetermined sequences or multiples, the method proceeds to block 504 and one or more capacitors can be installed having a first orientation. For example, a single capacitor, or a multiple of capacitors having the same orientation, can be provided within a reel and installed. In one form, an electronics installation tool, such as an automated pick-and-place tool, operable to install electronic components to a PCB can be employed. Upon installing one or more capacitors having a first orientation, the method can proceed to block 506, and one or more capacitors having a second orientation can be installed. The method can then proceed to decision block 508, and if the installation of capacitors is not completed, the method can proceed to block 504 and repeat as desired. If at decision block 508, installation of components is completed, the method determines if additional components are to be installed. The method can then proceed to block 512 and end.

If at decision block 502, a multiple-orientation reel is not being used (e.g. single orientation reels are used), the method can proceed to block 514 and a first reel having capacitors with a first orientation can be staged. The method can then proceed to block 516 and a second reel having capacitors with a second orientation can be staged. The method then proceeds to block 518 and capacitors having a first orientation can be installed from the first reel at specific locations on a PCB. The method can then proceed to block 520 and capacitors having a second orientation can be installed from the second reel at specific locations on the PCB. At decision block 522, if additional capacitors need to be installed, the method can proceed to block 518 and repeat as desired. If the installation of capacitors is completed, the method can proceed to block 524, and install additional components, if desired, and to block 526 and end.

Although illustrated as installing other components after installing the capacitors, it should be understood that the method can be modified as desired to allow for various installation sequences. Additionally, the method can be modified to include a reel of capacitors not having a predetermined orientation. For example, an identification process can be included as a part of the method prior to installing a capacitive element. As such, a process to identify an orientation of a capacitor prior to installing can be included within the method of FIG. 5.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A printed circuit board (PCB) comprising:
a first multiple-layered capacitor including a first orientation and placed along a surface operable to mount electronic components; and
a second multiple-layered capacitor including a second orientation different from the first, the second multiple-layered capacitor placed along the surface near the first multiple-layered capacitor; said printed circuit board further comprising:
a first multiple of horizontal orientated multiple-layered capacitors placed along the surface; and
a first multiple of vertical orientated multiple-layered capacitors placed along the surface relative to the first multiple of horizontal orientated multiple-layered capacitors.

2. The PCB of claim 1, wherein the first multiple-layered capacitor and the second multiple-layered capacitor include approximately equal capacitive values.

3. The PCB of claim, wherein:
the first multiple of horizontal orientated multiple-layered capacitors includes: the first multiple-layered capacitor including a first horizontal orientated multiple-layered capacitor; and
a second horizontal orientated multiple-layered capacitor located next to the first multiple-layered capacitor; and
the first multiple of the vertical orientated multiple-layered capacitors includes: the second multiple-layered capacitor including a first vertical orientated multiple-layered capacitor;
a second vertical orientated multiple-layered capacitor located next to the second multiple-layered capacitor;
a third vertical orientated multiple-layered capacitor located next to the second multiple-layered capacitor.

4. The PCB of claim 1, wherein the first multiple-layered capacitor includes a reference to identify an orientation of a multiple-layered plate housed within a housing of the first multiple-layered capacitor.

5. The PCB of claim 1, wherein the first multiple-layered capacitor and the second multiple-layered capacitor are aligned.

6. The PCB of claim 4, wherein the first multiple-layered capacitor and the second multiple-layered capacitor are rectangular shaped.

7. An information handling system comprising:
a printed circuit board including:
a first horizontal orientated multiple-layered capacitor placed along a surface of the PCB; and
a second vertical orientated multiple-layered capacitor placed along the surface of the PCB near the first multiple-layered capacitor; and
input power coupled to the capacitors, the input power to charge the first multiple-layered capacitor and the second multiple-layered capacitor at approximately the same time; said information handling system further comprising:
a first multiple of horizontal orientated multiple-layered capacitors placed along the surface of the PCB at a first interval;
a second multiple of vertical orientated multiple-layered capacitors place along the surface of the PCB at a second interval; and the input power to charge the first multiple and the second multiple.

8. A method comprising:
providing a first multiple-layered capacitor having a first plate orientation at a first surface of a printed circuit board (PCB);
providing a second multiple-layered capacitor at the first surface of the PCB adjacent to the first multiple-layered capacitor, the second multiple-layered capacitor having a second plate orientation different from the first plate orientation; and
providing input power to the first multiple-layered capacitor and to the second multiple-layered capacitor, the input power to charge the first multiple-layered capacitor and the second multiple-layered capacitor at approximately the same time: the method further comprising:

providing a first multiple of horizontal orientated multiple-layered capacitors placed along the surface; and providing a first multiple of vertical orientated multiple-layered capacitors placed along the surface relative to the first multiple of horizontal orientated multiple-layered capacitors.

9. The method of claim 8 wherein the first multiple-layered capacitor and the second multiple-layered capacitor include approximately equal capacitive values.

10. The method of claim 8, wherein:

providing the first multiple of horizontal orientated multiple-layered capacitors at the first surface, the first multiple of horizontal orientated multiple-layered capacitors including the first horizontal orientated multiple-layered capacitor and a second horizontal orientated multiple-layered capacitor located adjacent to the first multiple-layered capacitor; and providing the first multiple of vertical orientated multiple-layered capacitors at the first surface, the first multiple of vertical orientated multiple-layered capacitors including the first vertical orientated multiple-layered capacitor, a second vertical orientated multiple-layered capacitor located next to the second multiple-layered capacitor, and a third vertical orientated multiple-layered capacitor located next to the second multiple-layered capacitor, and wherein the first multiple of vertical orientated multiple-layered capacitors is adjacent to the first multiple of horizontal orientated multiple-layered capacitors.

11. The method of claim 8, wherein the first multiple-layered capacitor and the second multiple-layered capacitor are aligned.

* * * * *